US012625306B2

(12) United States Patent (10) Patent No.: US 12,625,306 B2
Wei et al. (45) Date of Patent: May 12, 2026

(54) THIN FILM NARROW BANDWIDTH TRANSMISSION FILTER FOR OPTICAL EMITTERS

(71) Applicant: Lumentum Operations LLC, San Jose, CA (US)

(72) Inventors: Cailin Wei, San Jose, CA (US); Jihua Du, San Jose, CA (US); Prasad Yalamanchili, San Jose, CA (US)

(73) Assignee: Lumentum Operations LLC, San Jose, CA (US)

( * ) Notice: Subject to any disclaimer, the term of this patent is extended or adjusted under 35 U.S.C. 154(b) by 571 days.

(21) Appl. No.: 18/068,314

(22) Filed: Dec. 19, 2022

(65) Prior Publication Data

US 2024/0159948 A1 May 16, 2024

Related U.S. Application Data

(60) Provisional application No. 63/383,818, filed on Nov. 15, 2022.

(51) Int. Cl.
*G02B 5/20* (2006.01)
*G02B 17/08* (2006.01)
*G02B 27/30* (2006.01)
*H01S 5/14* (2006.01)

(52) U.S. Cl.
CPC .............. *G02B 5/208* (2013.01); *G02B 5/20* (2013.01); *G02B 17/086* (2013.01); *G02B 27/30* (2013.01); *H01S 5/141* (2013.01)

(58) Field of Classification Search
CPC ...... G02B 5/208; G02B 17/086; G02B 27/30; G02B 5/20; H01S 5/141; H01S 5/14; H01S 2301/163
See application file for complete search history.

(56) References Cited

U.S. PATENT DOCUMENTS

| | | | | |
|---|---|---|---|---|
| 6,496,523 B1 * | 12/2002 | Wach | | H01S 5/141 |
| | | | | 372/98 |
| 10,224,687 B1 * | 3/2019 | Sobczynski | | H01S 3/227 |
| 2012/0219023 A1 * | 8/2012 | Cahill | | H01S 5/141 |
| | | | | 372/20 |
| 2016/0111850 A1 * | 4/2016 | Muendel | | H01S 3/08036 |
| | | | | 372/9 |
| 2016/0164255 A1 * | 6/2016 | Poustie | | H01S 5/0654 |
| | | | | 359/239 |
| 2017/0222395 A1 * | 8/2017 | Guo | | H01S 5/02326 |
| 2019/0008388 A1 * | 1/2019 | Ando | | G02B 21/16 |

FOREIGN PATENT DOCUMENTS

WO    WO-2013137592 A1 *  9/2013  ............... H01S 3/13

OTHER PUBLICATIONS

"Technica Releases it's T50 / Wavelength Locker FBG," Technica Optical Components: https://technicasa.com/technica-introduces-its-t50-wavelength-locker-fbg/, 2018, 4 pages.

* cited by examiner

*Primary Examiner* — Jia X Pan
(74) *Attorney, Agent, or Firm* — Harrity & Harrity, LLP

(57) ABSTRACT

In some implementations, an optical system includes an optical emitter, a locking apparatus, wherein the locking apparatus comprises a narrow bandwidth transmission filter (NBTF) and a partial reflection surface, wherein the locking apparatus is aligned to an optical output of the optical emitter, and wherein the locking apparatus is configured to provide optical feedback to the optical emitter.

20 Claims, 6 Drawing Sheets

200

210

220

230

240

225

THIN FILM NARROW BANDWIDTH TRANSMISSION FILTER FOR OPTICAL EMITTERS

CROSS-REFERENCE TO RELATED APPLICATION

This patent application claims priority to U.S. Provisional Patent Application No. 63/383,818, filed on Nov. 15, 2022, and entitled "THIN FILM NARROW BANDWIDTH TRANSMISSION FILTER." The disclosure of the prior application is considered part of and is incorporated by reference into this patent application.

TECHNICAL FIELD

The present disclosure relates generally to optical filters and to thin film narrow bandwidth transmission filters for optical emitters.

BACKGROUND

In optical communications systems, a wavelength locked pump laser may be included as a component in a fiber amplifier module. For a single-mode wavelength locked pump laser system, a fiber Bragg grating (FBG) may be used as a wavelength selective reflective filter at an output fiber. The FBG may provide optical feedback to an optical emitter. Alternatively, a distributed feedback (DFB) diode chip may have a distributed grating which provides optical feedback to an optical emitter. For a multi-mode wavelength locked pump laser system, a volume Bragg grating (VBG) may be used to provide optical feedback for locking of an optical emitter.

SUMMARY

In some implementations, an optical system includes an optical emitter, a locking apparatus, wherein the locking apparatus includes a narrow bandwidth transmission filter (NBTF); and a partial reflection surface, wherein the locking apparatus is aligned to an optical output of the optical emitter, and wherein the locking apparatus is configured to provide optical feedback to the optical emitter.

In some implementations, an optical device includes a locking apparatus, wherein the locking apparatus includes an NBTF; and a partial reflection surface, wherein the NBTF and the partial reflection surface are implemented on different surfaces of a single optical element, and wherein the locking apparatus is configured to provide optical feedback.

In some implementations, an optical device includes a locking apparatus, wherein the locking apparatus includes an NBTF; and a partial reflection surface, wherein the NBTF is implemented on a first optical element and the partial reflection surface is implemented on a second optical element, the first optical element and the second optical element being separated by free space, and wherein the locking apparatus is configured to provide feedback.

DETAILED DESCRIPTION

Figure 1A:
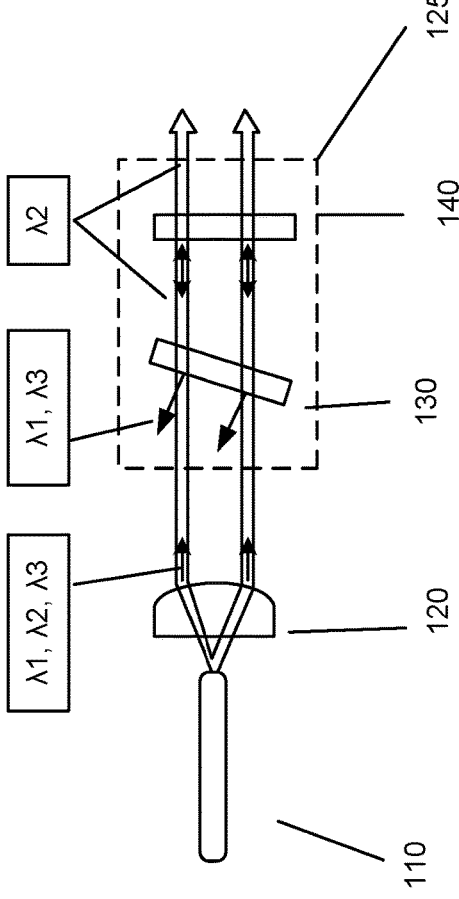
FIGS. 1A-1C are diagrams of examples associated with thin film narrow bandwidth transmission filters for optical emitters.

The following detailed description of example implementations refers to the accompanying drawings. The same reference numbers in different drawings may identify the same or similar elements.

Optical communication systems include optical emitters to emit optical beams. For example, a fiber amplifier node of an optical communication system may include a wavelength locked pump laser, such as a single-mode wavelength locked pump laser or a multi-mode wavelength locked pump laser. For example, a wavelength selective reflective filter, such as a fiber Bragg grating (FBG), may provide optical feedback for control of a single-mode wavelength locked pump laser. However, use of an FBG may be limited to fiber amplifiers that have fiber pigtails, which may prevent use of free space optics. Moreover, the FBG may be limited to structures where the fiber pigtails have coils with relatively large radii.

In another example, a distributed grating on a distributed feedback (DFB) diode chip may provide feedback, which may influence the wavelength of a single-mode wavelength locked pump laser of the DFB diode chip However, DFB diode chips may experience wavelength drift at different ranges of operating drive currents and temperature. Moreover, at higher power ranges, a DFB chip may show power ripple, which may negatively impact optical performance. In yet another example, a volume Bragg grating (VBG) can be used as a narrow bandwidth filter for locking of a multi-mode wavelength locked pump laser. However, VBGs may be difficult to manufacture and/or may be excessively costly. Accordingly, using VBGs may limit deployments of optical communications systems.

Some implementations described herein provide a locking apparatus that includes a narrowband transmission filter (NBTF) on a first surface of an optical element and a partial reflection surface on a second surface of an optical element. For example, an optical system may include an optical emitter, an NBTF on a first optical element, and a partial reflection surface on a second optical element. Alternatively, the optical system may include an optical emitter and an optical element with an NBTF on a first side and a partial reflection surface on a second side. In this case, by implementing a locking apparatus using an NBTF and a partial reflection surface, the locking apparatus can receive a beam from an optical emitter and provide narrowband optical feedback to the optical emitter.

In this way, the locking apparatus enables improved flexibility by enabling use with free space optics or fiber pigtails with relatively small coil radii. In some implementations, the locking apparatus enables a higher chip power relative to scenarios that are limited using DFB chips. Additionally, or alternatively, the locking apparatus enables improved wavelength stability at higher power levels than, for example, DFB chips. Additionally, or alternatively, the locking apparatus is more easily manufactured and cheaper than using a VBG. Additionally, or alternatively, the locking apparatus achieves lower temperature sensitivity than using a DFB chip for locking. Additionally, or alternatively, the locking apparatus enables easier integration of other passive optical components to be used in line-amplifiers. For example, the locking apparatus enables integration of beam splitters, lenses, or monitoring photodiodes, among other examples. Additionally, or alternatively, the locking apparatus can be integrated into a fiber-based platform (e.g., by coupling a free space beam into fiber) or a hybrid fiber and free space platform (e.g., that includes one or more of the abovementioned passive optical components among other examples).

Figure 1B:
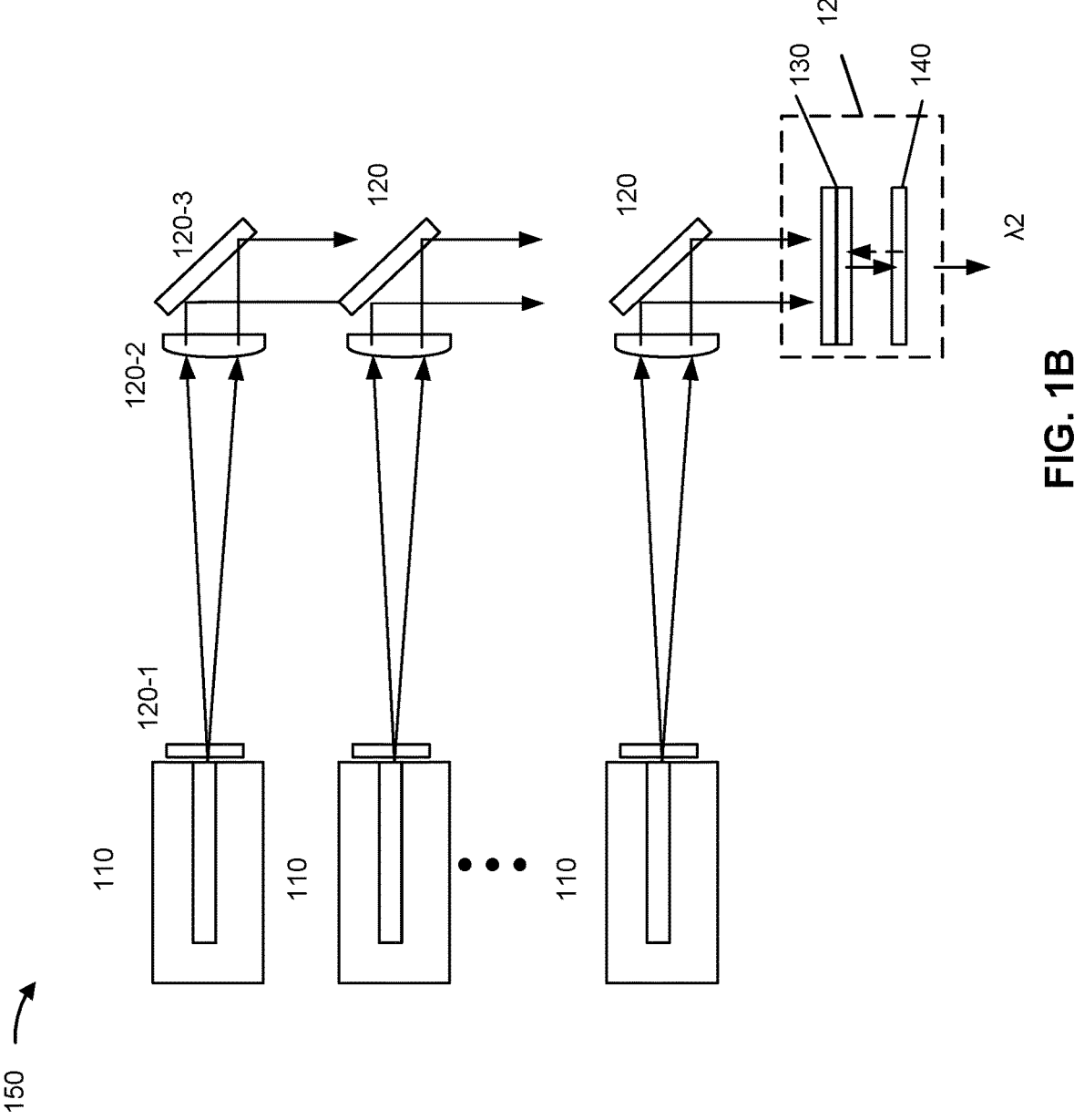
Figure 1C:
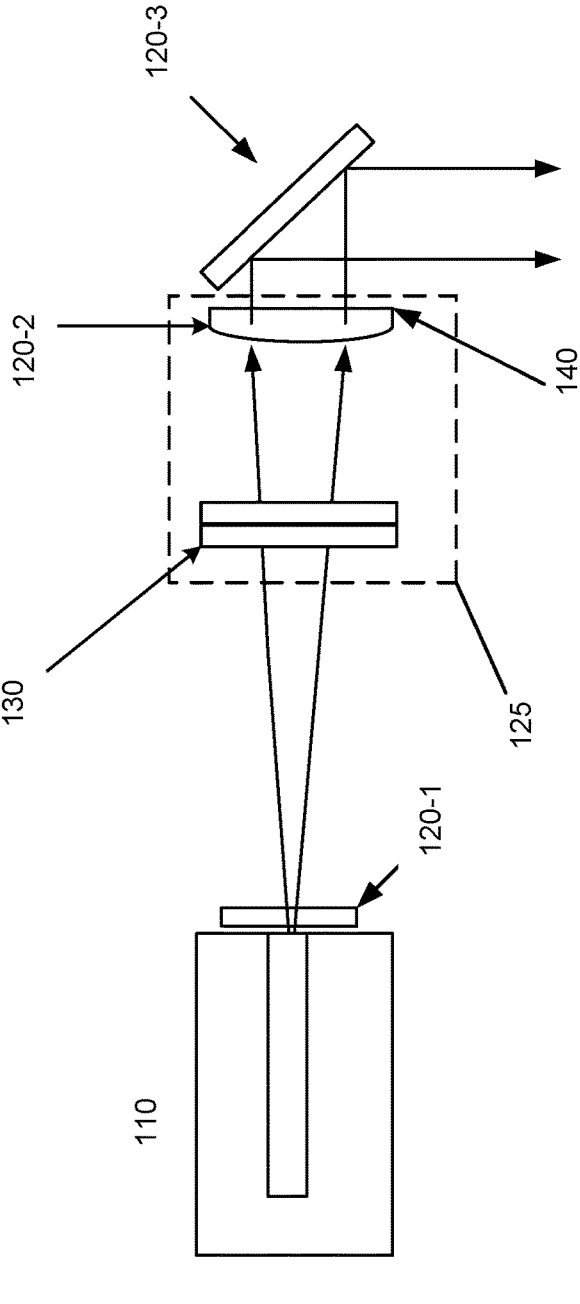

FIGS. 1A-1C are diagrams of examples associated with thin film narrow bandwidth transmission filters for optical emitters.

As shown in FIG. 1A, an optical system 100 is a free space optics implementation that includes an optical emitter 110, an optical element 120, and a locking apparatus 125. The locking apparatus 125 includes an NBTF 130 and a partial reflecting surface 140. In some implementations, the optical emitter 110 may include a single-mode pump laser (e.g., a diode) that emits a beam with a set of wavelengths $\lambda_1, \lambda_2, \ldots, \lambda_n$. Additionally, or alternatively, the optical emitter 110 may include a different type of optical emitter (e.g., a non-pump laser optical emitter). In some implementations, the optical emitter 110 may emit a beam with a wavelength range of 600 nanometers (nm) to 1600 nm or a sub-range thereof. In this case, the optical element 120 may be provided to alter the beam in some manner. For example, the optical element 120 may be a collimating lens that collimates the beam with respect to one or more axes. In this way, the optical emitter 110, with the optical element 120, can emit collimated light. In some implementations, the optical system 100 may omit the optical element 120, include additional optical elements 120, include different optical elements 120, or include differently arranged optical elements 120.

As further shown in FIG. 1A, the NBTF 130 transmits a configured wavelength range of the beam. For example, when the optical emitter 110 emits a beam with the set of wavelengths $\lambda_1, \lambda_2, \ldots, \lambda_n$, the NBTF 130 may transmit through the wavelength $\lambda_2$ (e.g., 976 nm or another wavelength) and may reflect or otherwise block other wavelengths (e.g., $\lambda_1, \lambda_2, \ldots, \lambda_n$). In this case, the NBTF 130 is configured with a transmissivity greater than a threshold, such as greater than 90%, greater than 95%, or greater than 99%, among other examples, at a single continuous wavelength range. In another example, the NBTF 130 may have a transmissivity greater than a threshold at a first wavelength range and at a second, different wavelength range. In this case, the NBTF 130 may be aligned to a first optical emitter 110 configured to emit a first beam at the first wavelength range (and may transmit through the first beam in a first direction) and a second optical emitter 110 configured to emit a second beam at the second wavelength range (and may transmit through the second beam in a second direction).

In some implementations, the NBTF 130 may be configured to transmit through a beam with a relatively narrow range of transmission wavelengths. For example, the NBTF 130 may pass through a wavelength range with a width of less than 1 nm, less than 0.5 nm, or between 0.3 and 0.5 nm, among other examples. In this case, when a beam is incident on the NBTF 130 with a range of 950 nm to 970 nm, the NBTF 130 may pass through a portion of the beam with a range of, for example, 965.0 nm to 965.5 nm (e.g., a width of 0.5 nm of wavelength range). In this way, the NBTF 130 ensures that an output of the optical emitter 110 that is passed to the partial reflecting surface is a relatively narrow bandwidth. In some implementations, the NBTF 130 may include a thin film filter. For example, the NBTF 130 may be a thin film filter with relatively few layers (e.g., compared with a narrow bandwidth reflective coating). In this case, by using a transmission filter rather than a reflective filter for the NBTF 130, the NBTF 130 achieves greater durability and reduced difficulty of manufacture.

As further shown in FIG. 1A, the partial reflecting surface 140 transmits through a first portion of the beam and reflects a second portion of the beam. For example, the partial reflecting surface 140 may transmit through a first portion of the beam (e.g., greater than 90%, greater than 95%, or between 95% and 97%, among other examples, of an optical power of the beam) and reflect back a second portion of the beam (e.g., less than 10%, less than 5%, or between 3% and 5%, among other examples, of the optical power of the beam). In this case the optical system 100 may output the first portion of the beam (e.g., as a wavelength locked, collimated output beam) and the locking apparatus 125 may provide feedback based on the second portion of the beam. For example, the partial reflecting surface 140 may direct the second portion back to the optical emitter 110. In this way, by splitting filtering functions and reflection functions (e.g., to NBTF 130 and partial reflection surface 140, respectively), the filtering functions can be achieved using a lower layer count than if the filtering functions and reflection functions were performed using a single optical element. Based on having a lower layer count, the NBTF 130 is more durable and can be manufactured more easily. Similarly, the partial reflection surface 140 can be achieved using relatively few layers and is highly manufacturable. Accordingly, splitting filtering functions and reflection functions reduces cost and improves durability for the optical system 100. In some implementations, the optical emitter 110 may be a multimode emitter. For example, the optical emitter 110 may be configured to emit more than one transverse mode.

As shown in FIG. 1B, in a multi-emitter, multi-mode pump laser operation, an optical system 150 may include multiple optical emitters 110 (e.g., chip-on-submount (COS) laser diode chips) and optical elements 120 aligned to a locking apparatus 125, which includes an NBTF 130 and a partial reflecting surface 140. In some implementations, an optical element 120 may be multiple optical elements 120. For example, as shown in FIG. 1B, an optical path may include an optical emitter 110, a first optical element 120-1 (e.g., a first lens that collimates a first axis of a beam), a second optical element 120-2 (e.g., a second lens that collimates a second axis of the beam), and a third optical element 120-3 (e.g., a reflector that directs the beam toward the locking apparatus 125).

In some implementations, a polarization beam combiner (PBC) (not shown) may be positioned in an optical path before the locking apparatus 125 to combine beams from the multiple optical emitters 110. Additionally, or alternatively, the locking apparatus 125 may be disposed at a combined beam area where beams from the multiple optical emitters 110 are directed. In this case, the locking apparatus 125 may provide shared narrowband feedback for the multiple optical emitters 110. In this way, by arranging the locking apparatus 125 at a combined beam area and/or at an output of a PBC, the optical system 150 can use a single NBTF 130 and partial reflecting surface 140 for multiple optical emitters 110, thereby reducing cost and enabling a smaller package for the optical system 150, relative to having multiple locking apparatuses.

In some implementations, the NBTF 130 is pitch-tilted relative to an optical path from the optical emitters 110 and toward the partial reflection surface 140. For example, the NBTF 130 and/or a carrier on which the NBTF 130 is disposed may be angled with respect to an optical path of an incoming beam. In this case, when a portion of the beam is reflected by the NBTF 130, the portion of the beam is not reflected back along an original path (e.g., an incoming path of the beam), which ensures that the portion of the beam that is reflected is not directed back to the optical emitter 110, which may cause degraded performance. In some implementations, the partial reflection surface 140 is a wide bandwidth filter. For example, the partial reflection surface 140 may be a 10% reflecting (e.g., 90% of an optical power of the optical beams from the optical emitters 110 passes through and 10% of the optical power is reflected) wide bandwidth filter that covers a bandwidth range of at least the NBTF 130.

In this way, multiple channels (e.g., of an optical communication system that includes the optical system 150) associated with the multiple optical emitters 110 share a single locking apparatus 125, which enables smaller optical systems or lower cost optical systems than another configuration where each optical emitter has a corresponding locking apparatus 125. Additionally, or alternatively, the optical system 150 may use passive alignment, for example, for the optical elements 120 (e.g., a set of slow axis collimators (SACs), which may reduce alignment time. Additionally, or alternatively, the locking apparatus 125 enables kink-free on-platform locking with higher power, relative to using a DFB chip.

As shown in FIG. 1C, another optical system 160 for multi-mode operation may include an optical emitter 110 and a locking apparatus 125. In this case, the locking apparatus 125 may include an NBTF 130, a partial reflection surface 140, and an optical element 120-2 (e.g., a lens for collimating an axis of a beam, the other axis being collimated by an optical element 120-1). Although optical system 160 is shown with a single optical emitter 110 and locking apparatus 125, it is contemplated that the optical system 160 can have multiple optical emitters 110 with multiple corresponding locking apparatuses 125.

As further shown in FIG. 1C, the NBTF 130 is disposed between the optical emitter 110 (e.g., a COS optical emitter) and the optical element 120-2. For example, the NBTF 130 may be pitch-tilted (e.g., angled with respect to a path of an incoming beam from the optical emitter 110) and coated on plate glass in the optical path of the optical emitter 110. In this case, the optical element 120-2 may include an SAC (slow axis collimator) onto which the partial reflection surface 140 is deposited. In other words, in this case, the flat back surface of the optical element 120 is used as the partial reflection surface 140. As further shown in FIG. 1C, another optical element 120-3 is disposed in an optical path after the optical element 120-2 to direct a beam from the optical emitter 110 toward a target (e.g., an optical fiber). In this case, the optical system 160 can be used for a channel-by-channel locker. In this way, by positioning the locking apparatus 125 closer to the optical emitter 110 in the optical system 160 relative to the optical system 150, the optical emitter 110 in the optical system 160 can use less power to achieve a configured level of power output to an optical fiber. For example, the partial reflection surface 140 in the optical system 160 may reflect a range of approximately 3% to 5% optical power, whereas the partial reflection surface 140 in the optical system 150 may reflect approximately 10% optical power. Additionally, or alternatively, the optical system 160 enables aligning of locking through the SAC lens and a fiber coupling through a folding mirror separately, which improves locking robustness (e.g., for far-end channels) and enhances coupling.

In some implementations, rather than a single emitter in optical system 160, optical system 160 may include multiple different emitters for multiple different wavelengths. For example, the optical system 160 may have a first NBTF 130 with a first wavelength (e.g., based on a first size, structure, or composition of the first NBTF 130) aligned to a first emitter with a first wavelength and a second NBTF 130 with a second wavelength (e.g., based on a second size, structure, or composition of the second NBTF 130) aligned to a second emitter with a second wavelength. In some implementations, the optical element 120-1 may include a fast axis collimator (FAC). For example, the NBTF 130 may be disposed between a FAC lens of optical element 120-1 and a SAC lens of optical element 120-2. In some implementations, the optical system 160 may use active alignment for the SAC lens. Additionally, or alternatively, the optical system 160 enables filtering for different wavelengths for each optical emitter 110 therein, rather than filtering for a single wavelength as occurs in the optical system 150.

As indicated above, FIGS. 1A-1C are provided as an example. Other examples may differ from what is described with regard to FIGS. 1A-1C.

Figure 2:
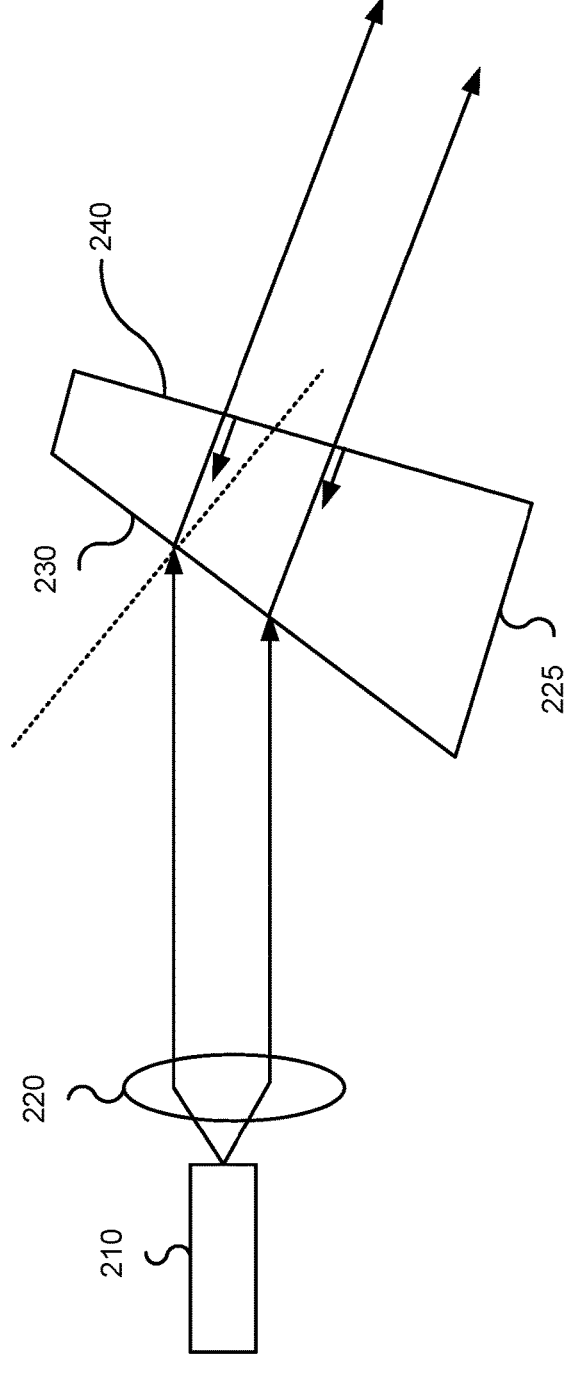
FIG. 2 is a diagram of an example associated with thin film narrow bandwidth transmission filters for optical emitters.

FIG. 2 is a diagram of an example optical system 200 associated with thin film narrow bandwidth transmission filters for optical emitters. As shown in FIG. 2, optical system 200 includes an optical emitter 210, an optical element 220 (e.g., a collimator), and a locking apparatus 225, which includes an NBTF 230 and a partial reflection surface 240.

As further shown in FIG. 2, optical system 200 includes a single optical element 225 configuration for the locking apparatus. In this case, rather than two discrete optical elements separated by free space, as described with regard to optical systems 200, 250, and 260, NBTF 230 and the partial reflection surface 240 are implemented on different faces of a single optical element 225. For example, the NBTF 230 may include a first set of layers of material formed on, formed from, or deposited on a first surface of a prism, and the partial reflection surface 240 may include a second set of layers of material formed on, formed from, or deposited on a second surface of the prism. In this way, the NBTF 230 and the partial reflection surface 240 are maintained in alignment by the prism, thereby improving a durability of the optical system 200 and reducing a difficulty in achieving the alignment. Additionally, or alternatively, the NBTF 230 and the partial reflection surface 240 use less space than when separated by free space, thereby enabling the optical system 200 to be packaged in a smaller package than other optical systems described herein.

As indicated above, FIG. 2 is provided as an example. Other examples may differ from what is described with regard to FIG. 2.

Figure 3A:
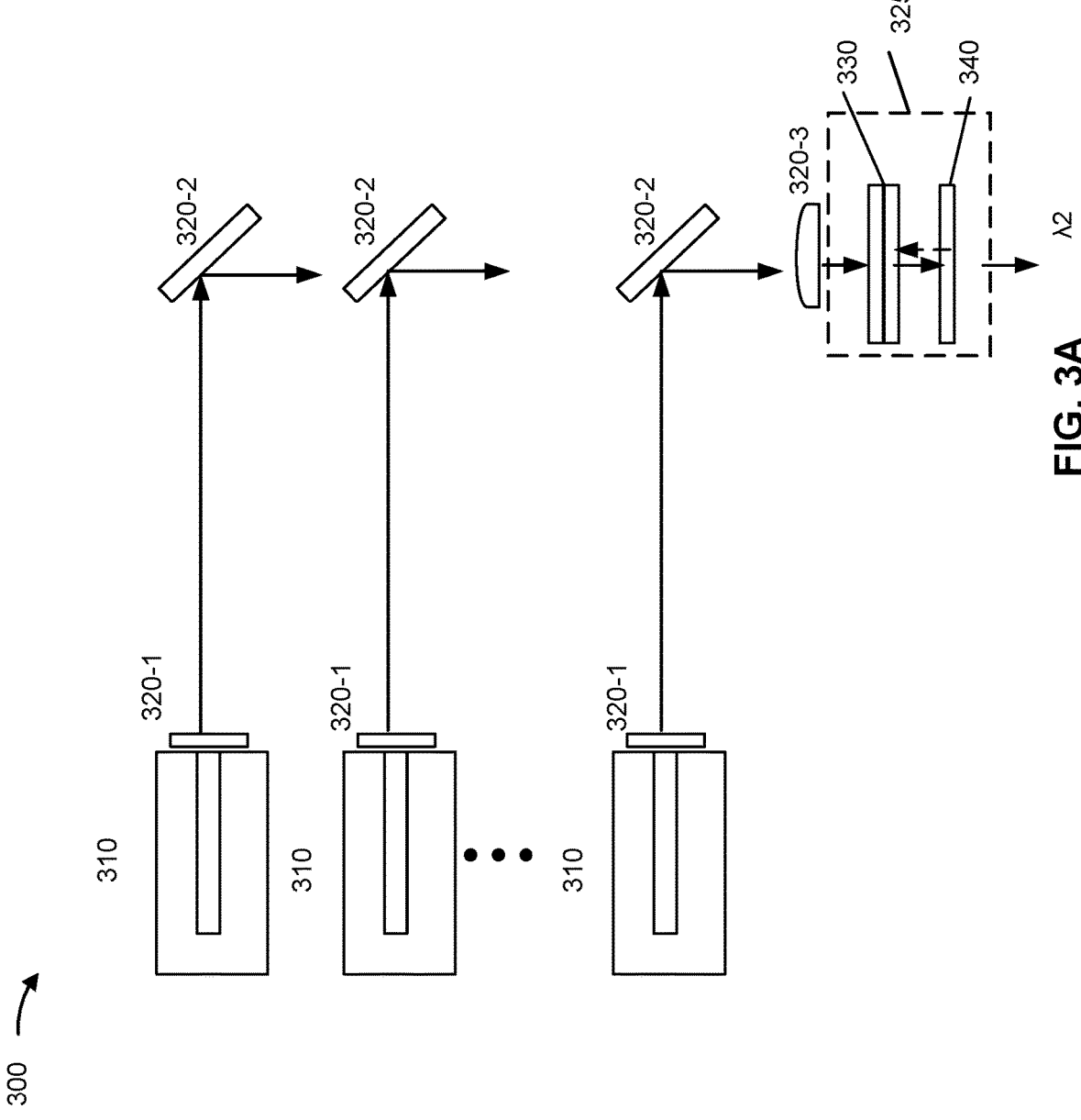
FIGS. 3A-3B are diagrams of examples associated with thin film narrow bandwidth transmission filters for optical emitters.
Figure 3B:
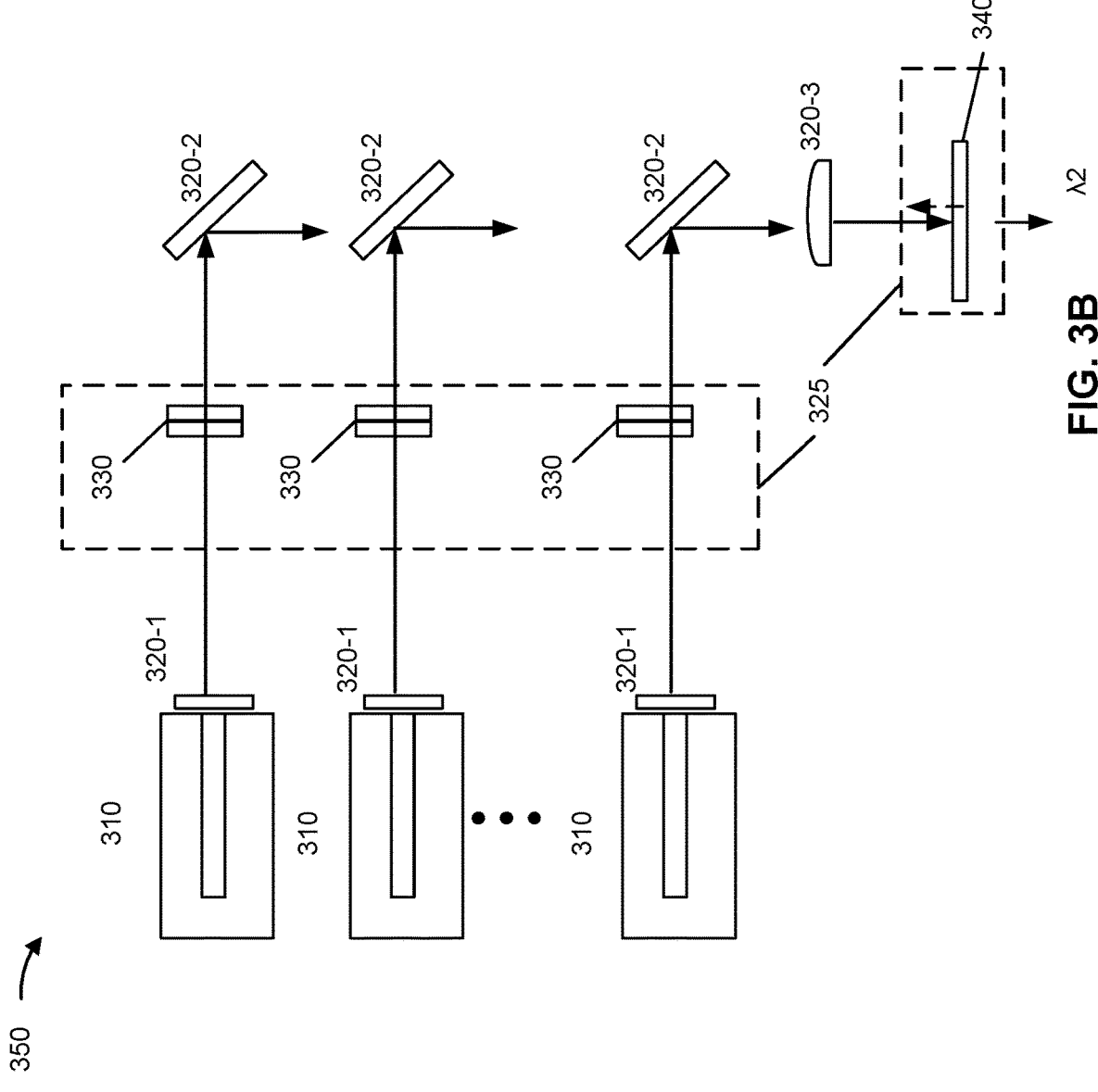

FIGS. 3A-3B are diagrams of examples associated with thin film narrow bandwidth transmission filters for optical emitters.

As shown in FIG. 3A, an optical system 300 includes a set of optical emitters 310, a set of optical elements 320, and a locking apparatus 325. The locking apparatus 325 includes an NBTF 330 and a partial reflecting surface 340.

As further shown in FIG. 3A, the multiple optical emitters 310 (e.g., chip-on-submount (COS) laser diode chips) and optical elements 320 are aligned to a single locking apparatus 325. For example, as shown in FIG. 3A, each optical emitter 310 may have an optical path that includes a first optical element 320-1 (e.g., a first lens that collimates a first axis of a beam) and a second optical element 320-2 (e.g., a reflector that directs the beam toward the locking apparatus 325). In this case, in contrast to the optical system 150 of FIG. 1B, optical paths of the optical emitters 310 share a single third optical element 320-3 (e.g., a second lens that collimates a second axis of the beam).

In some implementations, a polarization beam combiner (PBC) (not shown) may be positioned in an optical path before the locking apparatus 325 to combine beams from the multiple optical emitters 310. Additionally, or alternatively, the locking apparatus 325 may be disposed at a combined beam area where beams from the multiple optical emitters 310 are directed. In this way, by arranging the locking apparatus 325 at a combined beam area and/or at an output of a PBC, the optical system 300 can use a single NBTF 330 and partial reflecting surface 340 for multiple optical emitters 310, thereby reducing cost and enabling a smaller package for the optical system 300, relative to having multiple locking apparatuses.

In some implementations, multiple optical emitters 310 (e.g., all optical emitters 310) share a common wavelength. For example, the multiple optical emitters 310 may each emit a beam at the common wavelength and the single NBTF 330 may be configured to have a transmission peak at the common wavelength. In this way, the optical system 300 can emit a single narrow-bandwidth beam with wavelength locking, but use multiple optical emitters 310 to generate the optical power of the optical beam and/or communicate (e.g., independently or collectively) using the optical beam. Additionally, or alternatively, multiple optical emitters 310 (e.g., all optical emitters 310) may have different wavelengths. For example, a first optical emitter 310 may emit a first beam at a first wavelength and a second optical emitter 310 may emit a second beam at a second wavelength that is different from the first wavelength (e.g., by at least a threshold amount, such as by at least 1 nm, at least 3 nm, at least 5 nm, or at least 10 nm, among other examples). In this case, the NBTF 330 may be configured with multiple different transmission peaks corresponding to the different wavelengths of the optical emitters 310. Additionally, or alternatively, the NBTF 330 may be configured with a single transmission peak, but may have at least a threshold transmissivity (e.g., greater than 50%, greater than 75%, greater than 90%, greater than 95%, or greater than 99%, among other examples) across a bandwidth range that includes the different wavelengths of the optical emitters 310.

As shown in FIG. 3B, rather than the locking apparatus 325 including a single NBTF 330 shared by each of the optical emitters 310, an optical system 350 may include multiple NBTFs 330 aligned to the multiple optical emitters 310. For example, a first optical emitter 310 may direct a first beam toward a first NBTF 330 and a second optical emitter 310 may direct a second beam toward a second NBTF 330. Additionally, or alternatively, in another configuration, the optical system 350 may include multiple optical emitters 310 aligned to the same NBTF 330. For example, in another configuration, a first optical emitter 310 and a second optical emitter 310 may be aligned to a first NBTF 330 and a third optical emitter 310 and a fourth optical emitter 310 may be aligned to a second NBTF 330. In other words, the optical system 350 may include multiple NBTFs 330 and each NBTF 330 may be aligned to one or more optical emitters 310.

In some implementations, as described above, each optical emitter 310 may emit a beam with a common wavelength and each NBTF 330 may have a transmission peak at the common wavelength. For example, a first optical emitter 310 may emit a beam with a first wavelength to a first NBTF 330 with a transmission peak at the first wavelength and a second optical emitter 310 may emit a beam with the first wavelength to a second NBTF 330 with a transmission peak at the first wavelength. Additionally, or alternatively, different optical emitters 310 may emit beams with different wavelengths and different NBTFs 330 may have transmission peaks that encompass the different wavelengths, as described above. For example, a first optical emitter 310 may emit a first beam at a first wavelength to a first NBTF 330 with a transmission peak at the first wavelength and a second optical emitter 310 may emit a second beam at a second wavelength to a second NBTF 330 with a transmission peak at the second wavelength. It is contemplated that some NBTFs 330 may have multiple transmission peaks and receive multiple beams with multiple wavelengths as described above or that some NBTFs 330 may have a single transmission peak and receive multiple beams with a single wavelength as described above, among other examples of combinations of functionalities.

As indicated above, FIGS. 3A-3B are provided as an example. Other examples may differ from what is described with regard to FIGS. 3A-3B.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. An optical system, comprising:
an optical emitter,
a locking apparatus, wherein the locking apparatus comprises:
　a narrow bandwidth transmission filter (NBTF);
　a partial reflection surface,
　　wherein the locking apparatus is aligned to an optical output of the optical emitter, and
　　wherein the locking apparatus is configured to provide optical feedback to the optical emitter; and
　a fast axis collimator (FAC) and a slow axis collimator (SAC) aligned to an optical path of the optical emitter, the partial reflection surface, and the NBTF, wherein the partial reflection surface and the SAC are implemented in a single optical element.

2. The optical system of claim 1, wherein the optical emitter is a single-mode laser or a multi-mode laser.

3. The optical system of claim 1, wherein the NBTF and the partial reflection surface are implemented in separate, discrete optical elements and optically aligned to each other.

4. The optical system of claim 1, wherein the NBTF is angled relative to an optical path associated with the optical emitter.

5. The optical system of claim 1, wherein the NBTF is disposed in an optical path between the SAC and the FAC or between the SAC and the partial reflection surface.

6. The optical system of claim 1, wherein the NBTF has a transmissivity greater than a threshold at a single continuous wavelength range.

7. An optical device, comprising:
a locking apparatus, wherein the locking apparatus comprises:
a narrow bandwidth transmission filter (NBTF);
a partial reflection surface,
wherein the locking apparatus is configured to provide optical feedback; and
a fast axis collimator (FAC) and a slow axis collimator (SAC) aligned to an optical path of an optical emitter, the partial reflection surface, and the NBTF, wherein the partial reflection surface and the SAC are implemented in a single optical element.

8. The optical device of claim 7, further comprising the optical emitter.

9. The optical device of claim 7, wherein the optical emitter is a single-mode laser or a multi-mode laser.

10. The optical device of claim 7, wherein the NBTF has a transmissivity greater than a threshold at a single continuous wavelength range.

11. The optical device of claim 7, wherein the NBTF has a transmissivity greater than a threshold at a first wavelength range and a second wavelength range, the first wavelength range and the second wavelength range being different wavelength ranges.

12. The optical device of claim 11, further comprising: a set of emitters including a first emitter associated with emitting an optical beam in the first wavelength range and a second emitter associated with emitting the optical beam in the second wavelength range.

13. The optical device of claim 12, wherein the NBTF is optically aligned to a first optical element for the first wavelength range and a second optical element for the second wavelength range.

14. The optical device of claim 7, wherein the optical emitter is configured to emit an optical beam, the optical emitter being aligned to the NBTF and the partial reflection surface.

15. A device, comprising:
a locking apparatus, wherein the locking apparatus comprises:
　prises:
a narrow bandwidth transmission filter (NBTF);
a partial reflection surface,
wherein the locking apparatus is configured to provide feedback to an optical emitter; and
a fast axis collimator (FAC) and a slow axis collimator (SAC) aligned to an optical path of the optical emitter, the partial reflection surface, and the NBTF, wherein the partial reflection surface and the SAC are implemented in a single optical element.

16. The device of claim 15, further comprising the optical emitter.

17. The device of claim 15, wherein the optical emitter is a single-mode laser or a multi-mode laser.

18. The device of claim 15, wherein the NBTF and the partial reflection surface are implemented in separate, discrete optical elements and optically aligned to each other.

19. The device of claim 15, further comprising:
the optical emitter to emit an optical beam, the optical emitter being aligned to the NBTF and the partial reflection surface.

20. The device of claim 19, wherein the NBTF is a first NBTF having a first transmission wavelength and the optical emitter is a first optical emitter associated with emitting at the first transmission wavelength, and further comprising:
a second NBTF having a second transmission wavelength; and
a second optical emitter associated with emitting at the second transmission wavelength,
wherein the first optical emitter is aligned to the first NBTF and the second optical emitter is aligned to the second NBTF.

* * * * *